(12) United States Patent
Nichols et al.

(10) Patent No.: US 7,585,695 B2
(45) Date of Patent: Sep. 8, 2009

(54) LIGHTSHIELD ARCHITECTURE FOR INTERLINE TRANSFER IMAGE SENSORS

(75) Inventors: David N. Nichols, Fairport, NY (US); David L. Losee, Fairport, NY (US); Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 531 days.

(21) Appl. No.: 11/491,009

(22) Filed: Jul. 21, 2006

(65) Prior Publication Data

US 2006/0270092 A1  Nov. 30, 2006

Related U.S. Application Data

(62) Division of application No. 10/872,607, filed on Jun. 21, 2004, now Pat. No. 7,102,185.

(51) Int. Cl.
*H01L 21/00* (2006.01)

(52) U.S. Cl. .............. 438/75; 438/60; 438/78; 438/145; 257/222; 257/E31.001

(58) Field of Classification Search .......... 438/60, 438/75, 78, 145; 257/222, 225, 226
See application file for complete search history.

(56) References Cited

U.S. PATENT DOCUMENTS

| | | | |
|---|---|---|---|
| 4,521,797 A | 6/1985 | Oda | |
| 4,527,182 A | 7/1985 | Ishihara et al. | |
| 5,084,749 A | 1/1992 | Losee et al. | |
| 5,235,198 A | 8/1993 | Stevens et al. | |
| 5,250,798 A | 10/1993 | Iizuka et al. | |
| 5,371,397 A | 12/1994 | Maegawa et al. | |
| 5,424,775 A | 6/1995 | Kamisaka et al. | |
| 5,432,363 A | 7/1995 | Kamisaka et al. | |
| 5,510,285 A | 4/1996 | Kim | |
| 5,525,827 A | 6/1996 | Norman | |
| 6,133,060 A * | 10/2000 | Darwall et al. | 438/60 |
| 6,171,885 B1 | 1/2001 | Fan et al. | |
| 6,194,242 B1 | 2/2001 | Uchiya | |
| 6,274,917 B1 | 8/2001 | Fan et al. | |
| 6,379,993 B1 * | 4/2002 | Nakano et al. | 438/75 |
| 6,395,576 B1 | 5/2002 | Chang et al. | |

(Continued)

OTHER PUBLICATIONS

Nobukazu Teranishi et al., Smear Reduction in the Interline CCD Image Sensor, IEEE Transactions on Electron Devices, vol. ED-34, No. 5 May 1987, pp. 1052-1056.

(Continued)

*Primary Examiner*—Zandra Smith
*Assistant Examiner*—Christy L Novacek
(74) *Attorney, Agent, or Firm*—Peyton C. Watkins (57) ABSTRACT

An interline transfer type image sensing device that can be operated at high speed and with low image smear is described. The device incorporates a refractory metal layer which is used for both a light shield over the vertical charge transfer region and as a wiring layer for low resistance strapping of poly crystalline silicon (polysilicon) gate electrodes for the vertical charge transfer region. Plugs provided by a separate metallization layer connect the refractory light shield to the polysilicon gate electrode. These plugs allow high temperature processing after refractory light shield patterning for improved sensor performance without degradation of the polysilicon gate electrode or the refractory lightshield layer.

6 Claims, 11 Drawing Sheets

U.S. PATENT DOCUMENTS

| | | |
|---|---|---|
| 6,407,418 B1 | 6/2002 | Haga et al. |
| 6,504,188 B1 | 1/2003 | Maruyama et al. |
| 6,809,355 B2 | 10/2004 | Wada |
| 6,965,153 B1 | 11/2005 | Ono et al. |
| 2003/0214598 A1 | 11/2003 | Shizukuishi |
| 2004/0077121 A1 | 4/2004 | Maeda et al. |
| 2004/0132262 A1 | 7/2004 | Ayabe et al. |

OTHER PUBLICATIONS

David N. Nichols et al., Single-Chip Color HDTV Image Sensor with Two Polysilicon Levels and with $WSi_x$ Lightshield Used for Strapping Vertical Gates, 1992 International Electron Devices Meeting Technical Digest, 92-101, pp. 5.2.1-5.2.4.

K. Orihara et al., New Shunt Wiring Technologies for High Performance HDTV CCD Image Sensors, 1992 International Electron Devices Meeting Technical Digest 92-105, pp. 5.3.1-5.3.4.

* cited by examiner

FIG. 15

LIGHTSHIELD ARCHITECTURE FOR INTERLINE TRANSFER IMAGE SENSORS

CROSS-REFERENCE TO RELATED APPLICATIONS

This is a divisional of U.S. application Ser. No. 10/872,607, filed Jun. 21, 2004 now U.S. Pat. No. 7,102,185.

FIELD OF THE INVENTION

This invention relates to interlined image sensing devices and, more particularly, to such interlined image sensing devices having a plug disposed through the lightshield and insulator for directly connecting the gate electrode and lightshield for improving sensor performance.

BACKGROUND OF THE INVENTION

Figure 1:
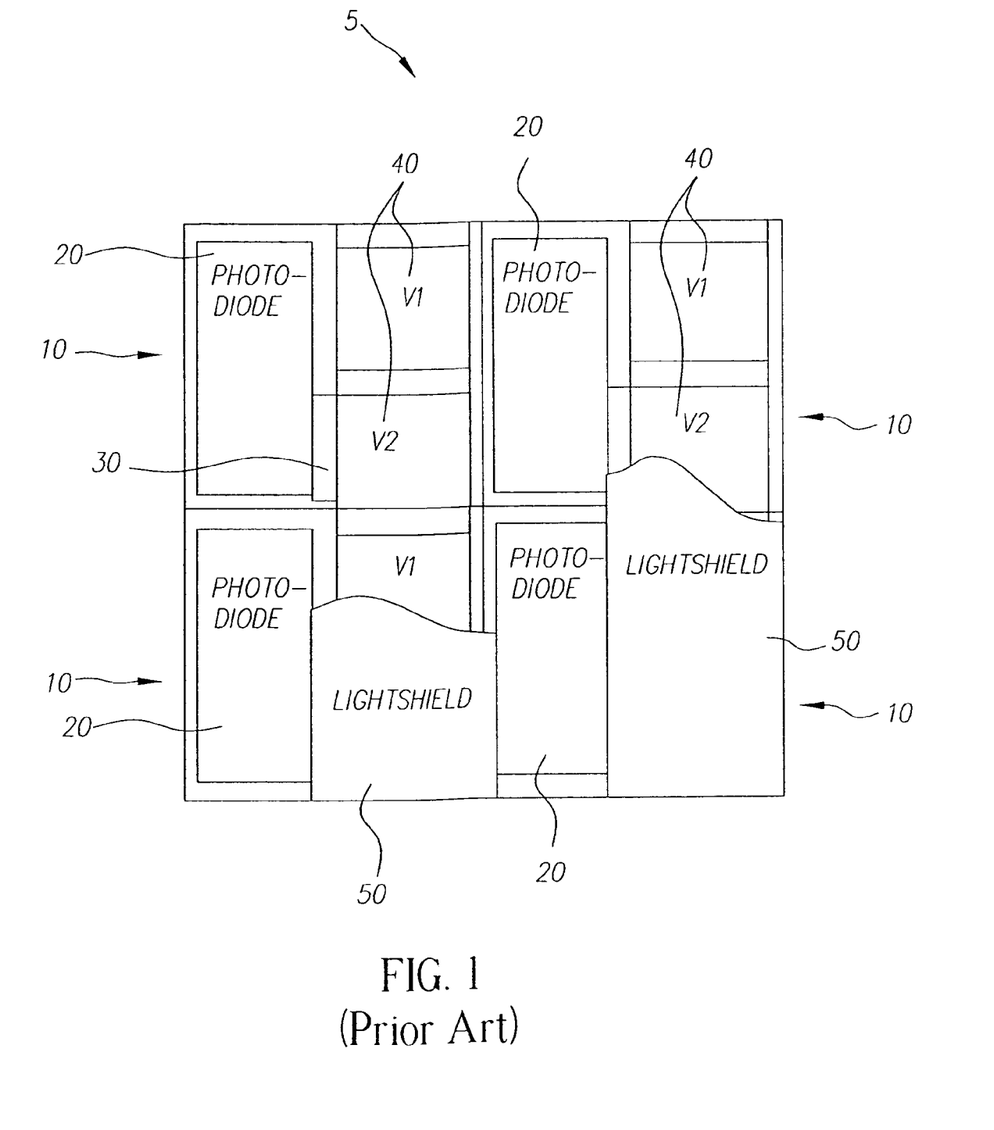
FIG. 1 is a top, plan view of a prior art image sensor.

Interline transfer architecture for solid-state image sensors is well known in the prior art. Examples of such prior art image sensors include U.S. Pat. No. 4,521,797 by Ishihara, et al., U.S. Pat. No. 5,084,749 by Losee et al, and U.S. Pat. No. 5,235,198 by Stevens, et al., and U.S. Pat. No. 4,527,182 by Ishihara, et al. In interline transfer devices, an array of photodetectors, such as photodiodes or photocapacitors collect and store photo-generated charge. A transfer gate associated with each photodiode enables the photo-generated charge to be transferred to a vertical shift register. This transfer typically occurs at the end of the image capture period. The vertical shift registers then transfer the charge to a horizontal shift register, which then transfers the photo-generated charge, pixel-by-pixel to an output structure. Referring to FIG. 1, a top plan view of a portion of an interline transfer image sensor 5 shows four pixels 10 each with a photodetector 20, transfer gate 30, and a portion of the vertical shift register 40.

Interline transfer image sensors have the ability to capture a new image while at the same time transferring the charge associated with the previous image capture to the output amplifier. This can be accomplished because the photo-detector is separate from the charge transfer areas. During the time required for the read-out operation, light is still incident on the photodiode or photo-capacitor, and photo-generated charge may be collected and stored for the following frame. In addition, the vertical shift registers 40, or vertical charge coupled device (VCCD), used for charge transfer, are covered with a lightshield 50 to prevent light from entering the silicon portion of the VCCD 40 and generating charge. The lightshield 50 is typically made from a metal layer such as aluminum, tungsten, or tungsten silicide.

While the lightshield 50 prevents most light from entering the silicon portion of the VCCD 40, it is not perfect, and several improvements have been disclosed over the years to reduce the exposure of the silicon in the VCCD 40 to light. Such exposure will produce spurious signals in the detected image, thus degrading the performance of the device. This spurious signal has been called image smear in the prior art literature. N. Teranishi and Y. Ishihara in IEEE Transactions on Electron Devices, ED-34, 1052, (1987) describe sources of smear and some approaches to reduce smear where aluminum is used as the lightshield material. Smear can be reduced by decreasing the insulator thickness between the lightshield material and the polysilicon gate electrode. To reduce that thickness, D. Losee and M. Mehra in U.S. Pat. No. 5,084,749 introduce the use of $WSi_x$ as lightshield material. In addition, this patent describes the use of a silicon oxide film doped with boron and/or phosphorus that is annealed and flowed on top of the lightshield 50 which results in improved topography for color filter array application. In addition, Losee et al. describe the shortcoming of $WSi_x$ where x=2 or x>2 because the transmission of such films allows too much light into the shift register, and also the advantages of $WSi_x$ where x<2 for improved opacity.

Figure 2:
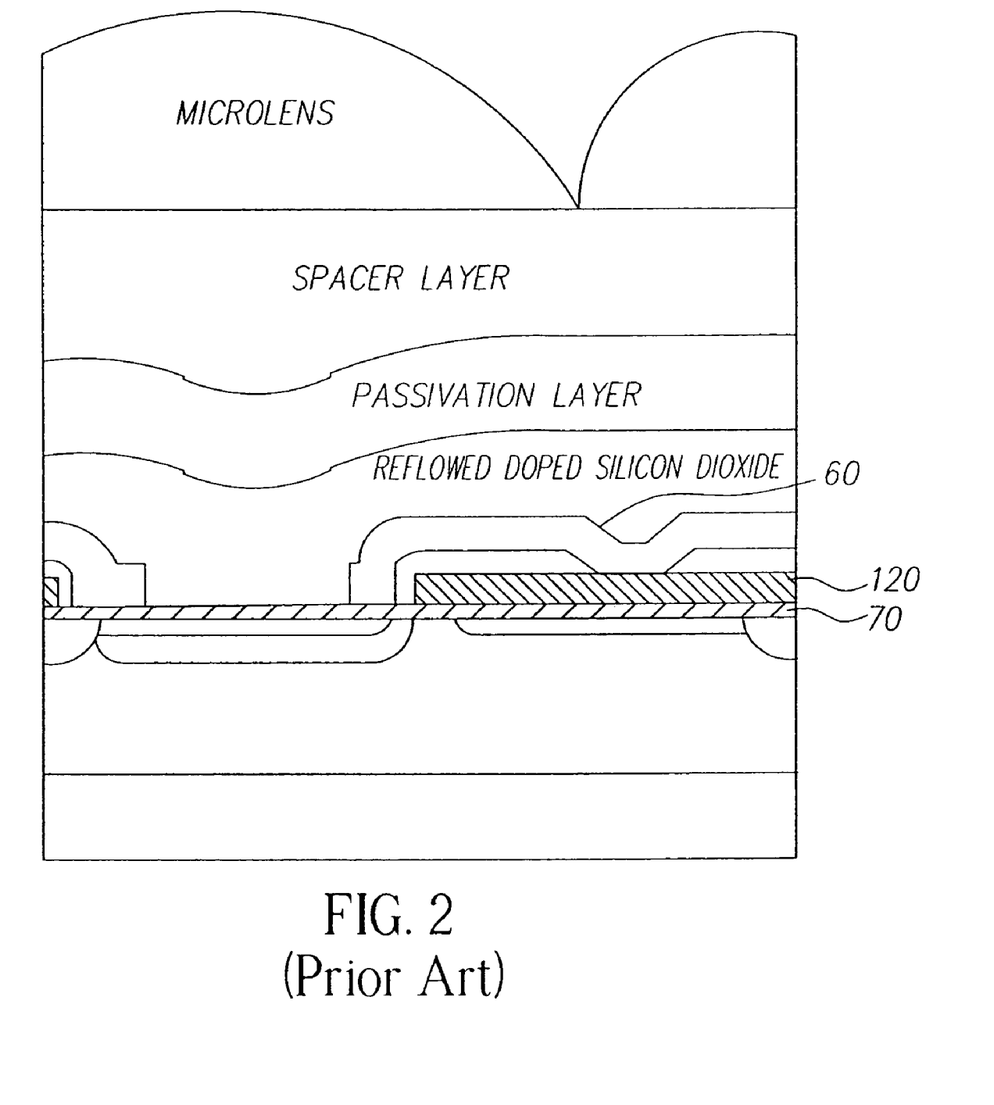
FIG. 2 is a side view in cross section of a prior art image sensor.

In large-area interline CCD devices, the high resistance of doped polysilicon electrodes combined with the large capacitance of the shift register limits the frame rate for these sensors. Because both $WSi_x$ and aluminum have lower resistivity than polysilicon, several schemes have been disclosed to shunt or strap the polysilicon electrodes using the lightshield layer. Referring to FIG. 2, Nichols et al. in "Single Chip Color HDTV Image Sensor with Two Polysilicon Levels and with $WSi_x$ Lightshield Used for Strapping Vertical Gates", 1992 International Electron Devices Meeting Technical Digest, 101, (1992) describe the incorporation of contact holes 60 cut into the dielectric 70 separating the lightshield and the polysilicon electrodes of the shift register to provide a lower resistance path for current to drive the shift register electrodes. A similar approach, but with a tungsten lightshield is described by K. Orihara et al. in "New Shunt Wiring Technologies for High Performance HDTV CCD Image Sensors", 1992 International Electron Devices Meeting Technical Digest, 105, (1992). K. Orihara prefers to use tungsten instead of aluminum because the aluminum shunt wiring requires a buffer layer of polysilicon between the aluminum and polysilicon electrodes to avoid formation of potential shifts which degrade charge transfer efficiency. Kamisaka in U.S. Pat. No. 5,432,363 also reports this degradation when aluminum shunt wiring is connected directly to the polysilicon electrode.

It is advantageous to provide a smooth surface upon which the aluminum-wiring layer is deposited and the subsequent color filter array is fabricated. As was described earlier, this is often accomplished through deposition of a boron and/or phosphorus containing silicon oxide film on top of the lightshield and photoactive regions, then annealing the structure at 800-950 C which causes the film to reflow and provide a smoother top surface. This reflowed film can also be used to help focus light into the photoactive region. Aluminum as a lightshield material cannot be used in this approach because aluminum melts at temperatures below the reflow annealing temperature.

Figure 3:
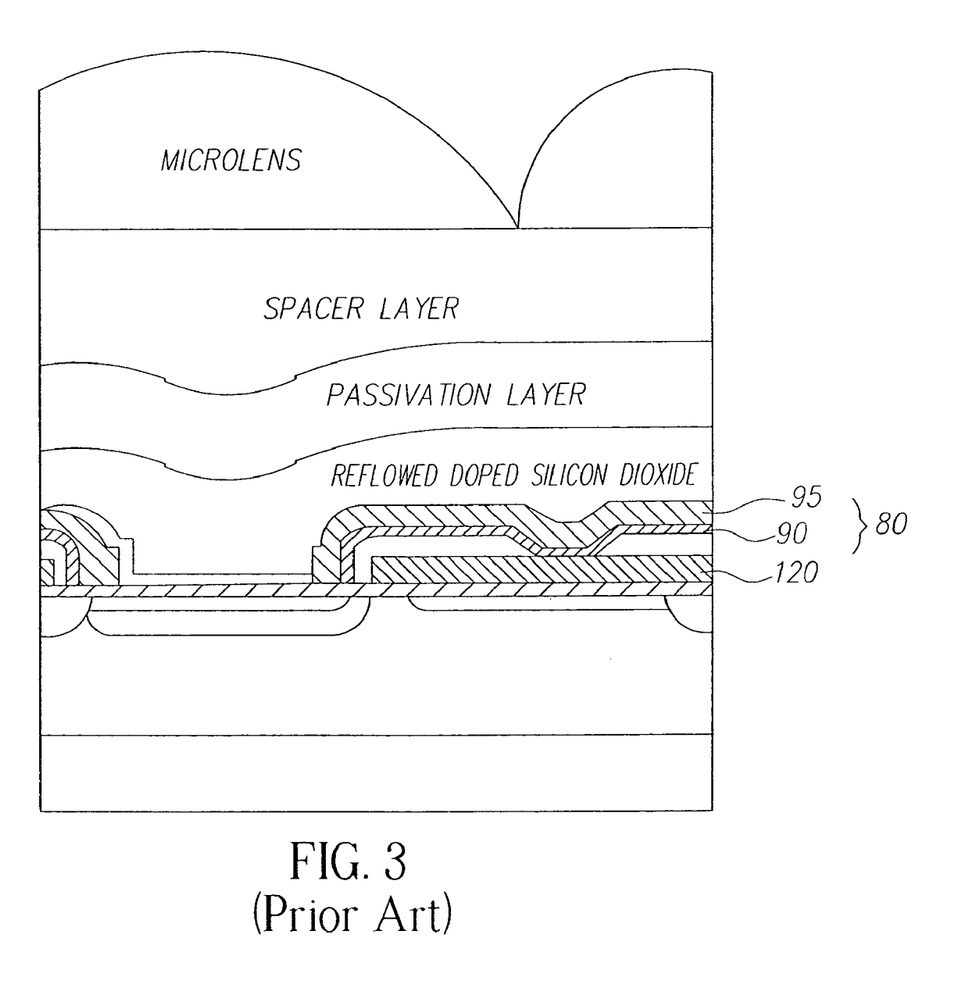
FIG. 3 is a side view in cross section of a prior art image sensor.

Referring to FIG. 3, Kamisaka discloses a lightshield 80 consisting of two layers, a polysilicon layer 90 below a refractory metal or refractory metal silicide 95. Because the high-temperature anneal is desired for reflow of a doped oxide deposited over the lightshield, the bottom layer of polysilicon is used to prevent a degradation of charge transfer efficiency due to interaction of the refractory metal with the polysilicon gate electrode at reflow anneal temperatures. Y. Maruyama and D. Sugimoto in U.S. Pat. No. 6,504,188 state that the contact resistance between the refractory metal lightshield film and the polysilicon electrode increases due to heat treatment of the dielectric film covering the lightshield which is in direct contact with the polysilicon gate electrode. Therefore they describe the use of a lightshield consisting of polysilicon layer below a refractory metal nitride or oxide, as well as a refractory metal layer.

The addition of a polysilicon layer below the lightshield adds additional processing steps such as the deposition of polysilicon, heavy phosphorus doping of the polysilicon layer using POCl3 or high-dose implantation. In some cases, separate photolithography and etching steps separate from the refractory lightshield patterning steps are necessary. This polysilicon layer also increases the topography of the device which may cause difficulties in depositing and patterning of later layers.

SUMMARY OF THE INVENTION

The present invention is directed to overcoming one or more of the problems set forth above. Briefly summarized, according to one aspect of the present invention, the invention includes an image-sensing device that uses a refractory metal or refractory metal compound layer for the lightshield layer and to strap the polysilicon gate electrodes of the vertical shift register and, in addition, the use of a high temperature reflow of a doped glass over the lightshield layer. A technique to connect the lightshield to the polysilicon gate electrodes is described which does not have direct contact between the lightshield and the polysilicon electrodes during a high temperature reflow step and does not have an interlayer of doped polysilicon. Therefore the present invention provides a simpler lightshield structure and process without the degradation described in the background.

Connection between the polysilicon electrodes and the refractory metal light shield layer is provided by a separate metallization layer that forms plugs. This separate metallization layer is normally used to provide electrical connections or wiring between circuit elements and to external circuitry. The present invention extends the use of this layer to enable contact between the refractory metal lightshield and the polysilicon electrode. The use of these plugs enable high temperature processing after the refractory metal layer is deposited and patterned, but prevents the problems stated in the prior art. In addition, this approach does not require additional deposited films to be used as buffer layers, and therefore provides a simpler and more cost-effective manufacturing process.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

This present invention provides an architecture which connects a refractory metal lightshield (such as provided by a tungsten film) to a polysilicon gate electrode without the need for barrier layers and without degradation of the image due to interaction at high temperature between the refractory lightshield and the polysilicon gate electrode. In addition this invention incorporates the reflow or anneal of a doped silicon dioxide film for improved image sensor performance.

DETAILED DESCRIPTION OF THE INVENTION

Figure 4:
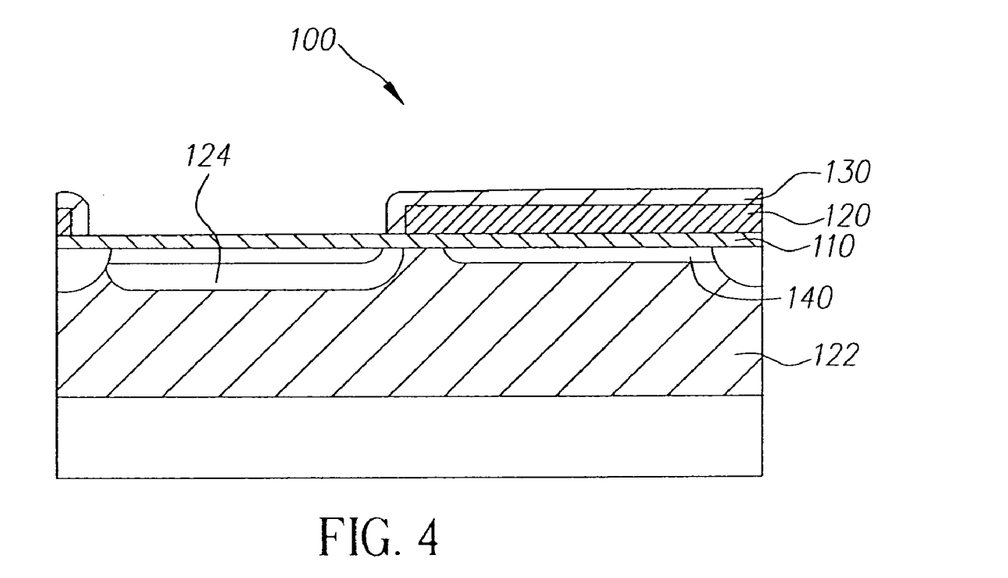
FIG. 4 is a side view in cross section of the image sensor of the present invention.

Referring to FIG. 4, there is shown the cross-section of an interline transfer pixel of the image sensor 100 of the present invention after the silicon doping layers have been formed, the gate dielectric 110 and polysilicon gate electrode 120 have been deposited and patterned, and a silicon dioxide isolation layer 130 has been grown on the polysilicon gate 120. Silicon substrate dopant regions 122, gate dielectric 110, and gate electrodes 120 form a portion of the essential elements for the interline transfer pixel as described hereinabove. In addition to those elements, a plurality of photodiodes or photosensitive areas 124 (only one is shown in FIG. 4) receive incident light that is converted into charge that is eventually transferred to the vertical CCD 140. Typically the vertical shift register portion 140 of an interline imager is constructed with many polysilicon gate electrodes 120 to enable transfer of photo-generated charge by a charge-coupled device (CCD) structure. The electrodes are clocked in two, three, or four phases and therefore are wired so that every second, third or fourth electrode receives the same applied voltage, respectively. An isolation silicon dioxide 130 formed by the thermal oxidation of the polysilicon is created on the polysilicon gate electrode 120 by exposing the structure to an oxidizing atmosphere at high temperature. Typically this may be performed at 950 degrees C. in a steam environment for 10 minutes. This silicon dioxide layer 130 electrically isolates the polysilicon gate electrode 120 from the conductive lightshield layer to be deposited next. This isolation silicon dioxide 130 may also be deposited by chemical vapor deposition or may be a combination of silicon dioxide growth along with a deposited insulator. Other dielectrics films may also be used.

Figure 5:
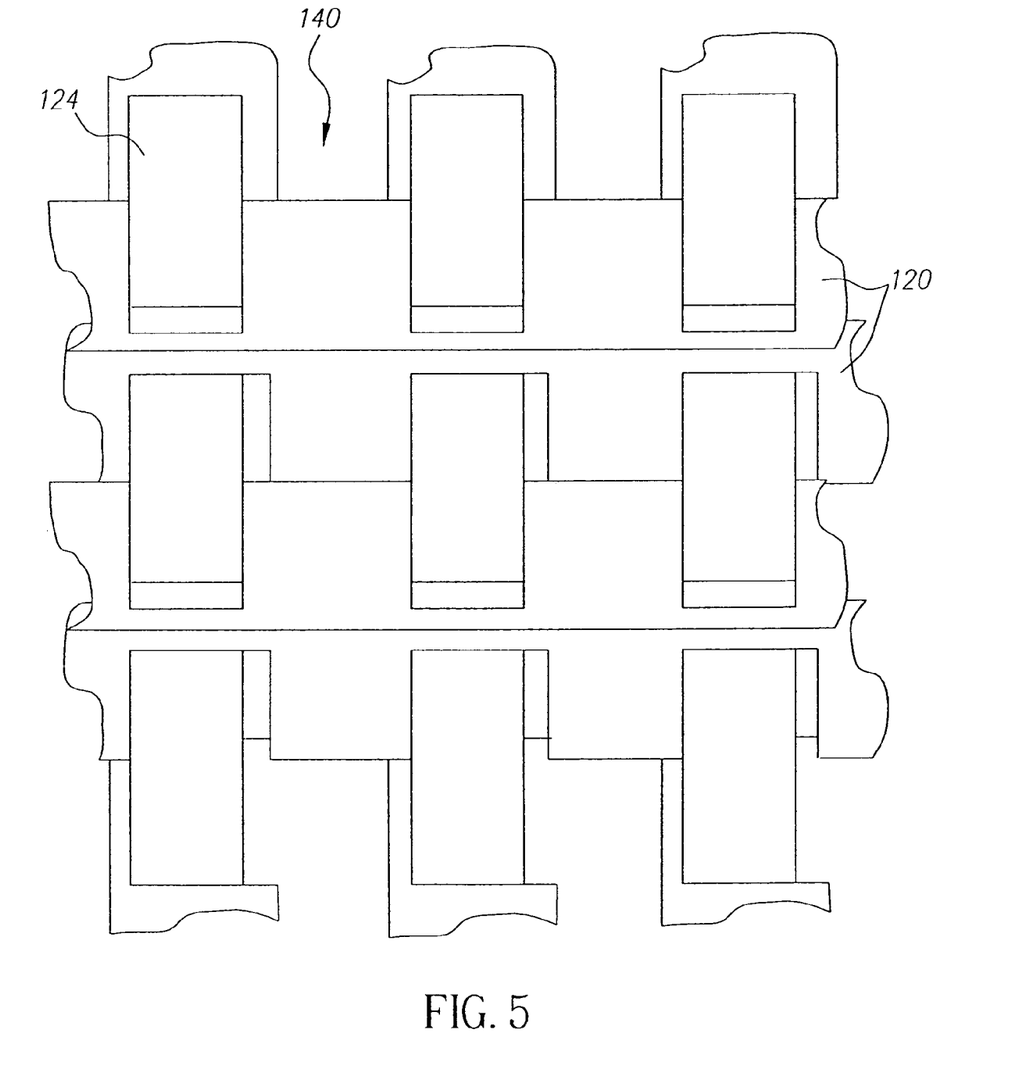
FIG. 5 is a top, plan view of the image sensor of the present invention.

Referring to FIG. 5, there is shown a diagram of a plan view of the interline transfer architecture which shows the photodiode area 124 and the vertical shift register 140 with two polysilicon gate electrodes 120 in each pixel. In this embodiment, the vertical CCD 140 operates as a two-phase CCD, as described by Stevens et al. in U.S. Pat. No. 5,235,198. The isolation silicon dioxide layer 130 is not shown in FIG. 5.

Figure 6:
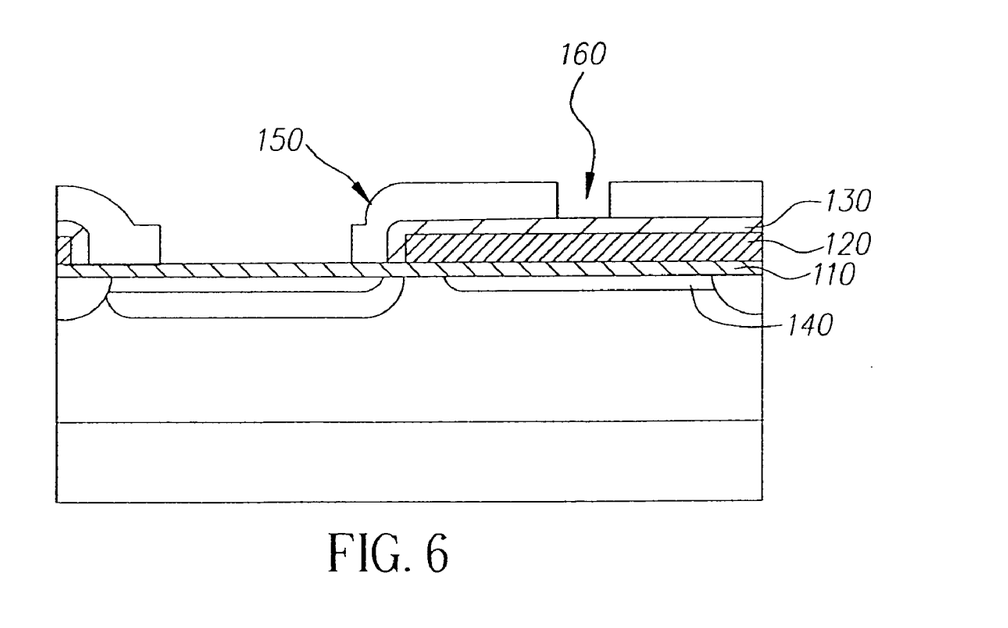
FIG. 6 is a side view in cross section of the image sensor of the present invention.

Referring to FIG. 6, the lightshield layer 150 is preferably formed by deposition of a tungsten or other refractory metal film. Other conductive films which have a high-temperature melting point may also be used. These films include, for example, a silicide, nitride, or oxide of some transition metals. Examples include titanium nitride and tungsten silicide. The film is then patterned by photolithographically patterning a photoresist mask and then etching the film with suitable plasma etch. Film thickness must be sufficient to prevent light penetration. Processes for patterning refractory metal films or their compounds are well known in the art.

The propagation of the clock signal in large area interlines often limits the speed of operation for the vertical CCD and therefore limits frame rate. The time-constant for propagation of a signal along the polysilicon electrode is characterized by the RC product, where R=electrical resistance of the polysilicon line and C=capacitance of the polysilicon electrode to adjacent electrodes and to the silicon channel. As mentioned hereinabove, the lightshield film 150 is used to strap, or provide a more conductive path for signal propagation to the polysilicon electrode 120, and therefore allow higher framerate operation.

In this embodiment, the lightshield 150 is patterned in lines running in the direction of charge transport for the vertical CCD 140, (often called the vertical direction), while the polysilicon electrodes 120 run in the horizontal direction. The polysilicon electrodes 120 are typically clocked with either two, three, or four phases, and with each electrode phase receiving a different clock signal. Therefore, the lightshield 150 lines must be designed to provide the varying clock signals to the polysilicon electrodes 120 of the vertical shift register 140. This is accomplished by selecting certain vertical lightshield 150 lines to connect and strap one phase, and a separate group of lines to contact a different phase. For example, in a two-phase vertical shift register, all odd lightshield 150 lines are connected to electrodes for phase 1, while all even lightshield 150 lines are connected to electrodes for phase 2. While each lightshield 150 line overlaps all polysilicon gate electrodes 120, electrical contact is provided only between the appropriate lightshield 150 line and the polysilicon gate electrode 120.

Figure 7:
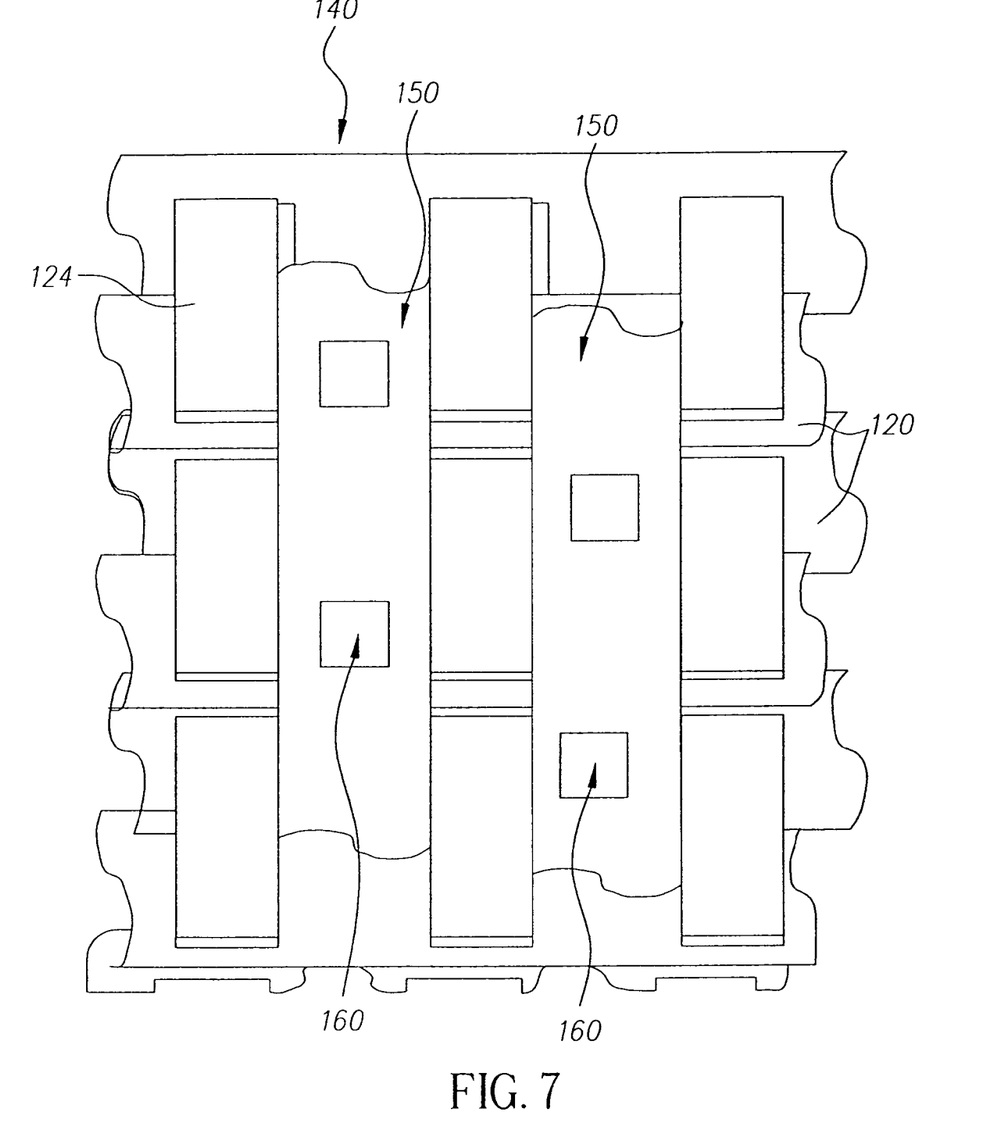
FIG. 7 is a top, plan view of FIG. 6.

In the prior art, a contact cut or opening is etched in the dielectric separating the lightshield film and the polysilicon electrode so that direct contact between the lightshield and polysilicon electrode can be made. However, as described in the background, this direct connection results in a detrimental interaction at high temperatures between the polysilicon and lightshield resulting in image degradation. Still referring to FIG. 6, an improvement in the present invention is that an opening 160 is provided in the lightshield film 150 through which another metal layer will be deposited and which contacts both the polysilicon gate electrode 120 and the lightshield line 150. The opening 160 is formed at the same time and as part of the photolithographic patterning of the lightshield 150. The opening 160 is large enough to allow for a contact hole to be placed in its center, but not so large as to hinder the same metal to contact the top surface of the lightshield 150. FIGS. 6 and 7 show cross section and plan views after the deposited and patterned lightshield layer 150 overlying the isolation silicon dioxide film 130. As shown in FIG. 7, the lightshield 150 vertical lines have openings 160 at different vertical locations to enable contact to different poly electrodes.

Figure 8:
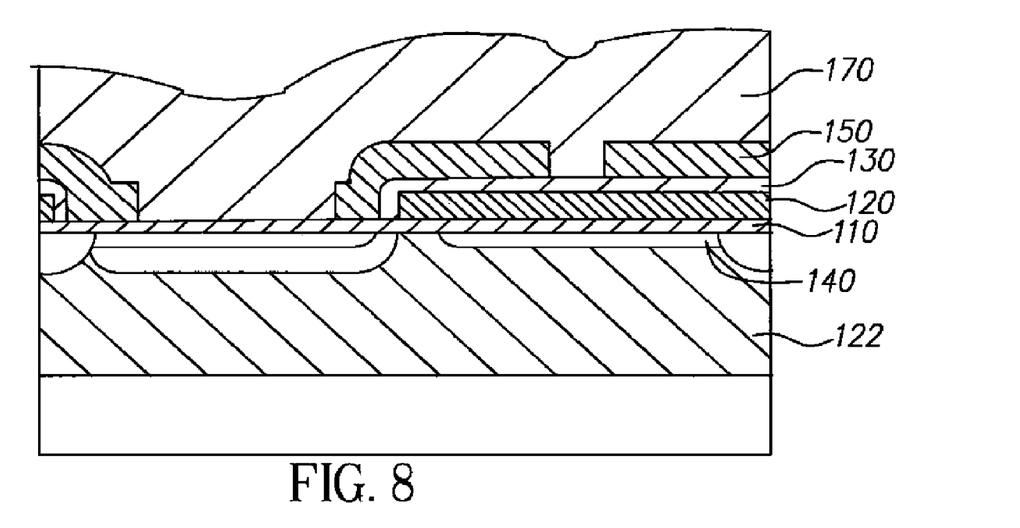
FIG. 8 is a side view in cross section of FIGS. 6 and 7 illustrating further steps in manufacturing.

As described in the background, it is advantageous to provide a smooth surface upon which the aluminum-wiring layer is deposited and the subsequent color filter array is fabricated. Referring to FIG. 8, this is often accomplished through deposition of a boron and/or phosphorus containing silicon oxide film 170 on top of the lightshield and photoactive regions, then annealing the structure at 800-950 degrees C. which causes the film to reflow and provide a smoother top surface. This reflowed film 170 can also be used to help focus light into the photoactive region. Because this layer undergoes a high temperature reflow, the underlying lightshield material must not decompose or melt during this high temperature step. Therefore refractory metal or refractory metal compounds are chosen for the lightshield. Note that in prior art, a contact hole is formed in the dielectric betwixt the lightshield and polysilicon gate electrode, allowing these materials to be in contact during the high temperature reflow. Prior art has described the degradation of the image capture capability due to interaction between these materials at the reflow temperatures. In the present invention, the electrical connection is made through a later metallization step, avoiding contact between the lightshield and polysilicon gate electrode films during high temperature processing. This doped silicon dioxide film is also used to provide electrical isolation and reduce capacitive coupling between the later-deposited metal lines and the underlying lightshield and polysilicon layers.

Figure 9:
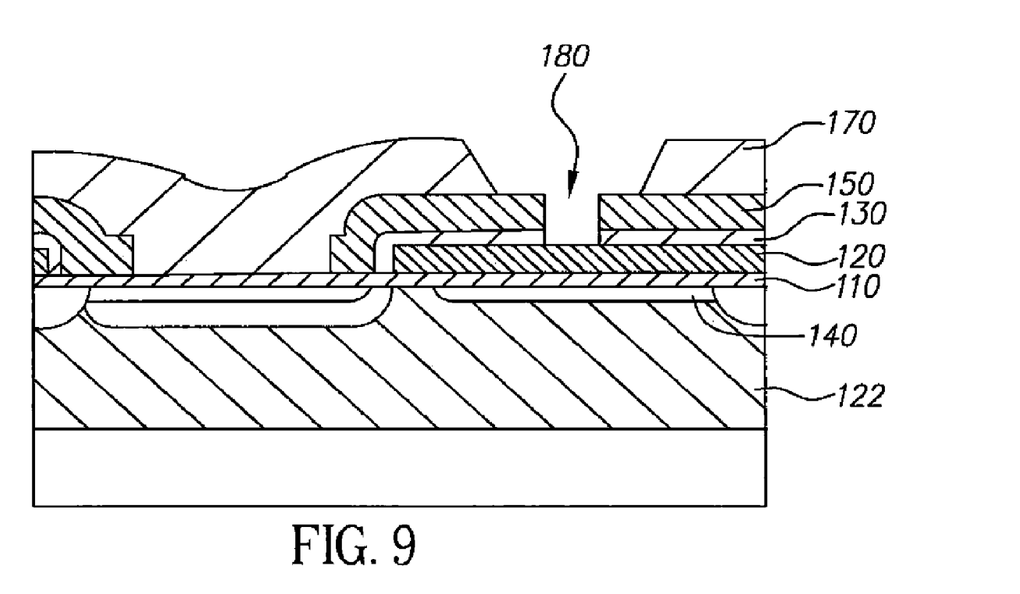
FIG. 9 is a side view in cross section of FIG. 8 illustrating another step in manufacturing.
Figure 10:
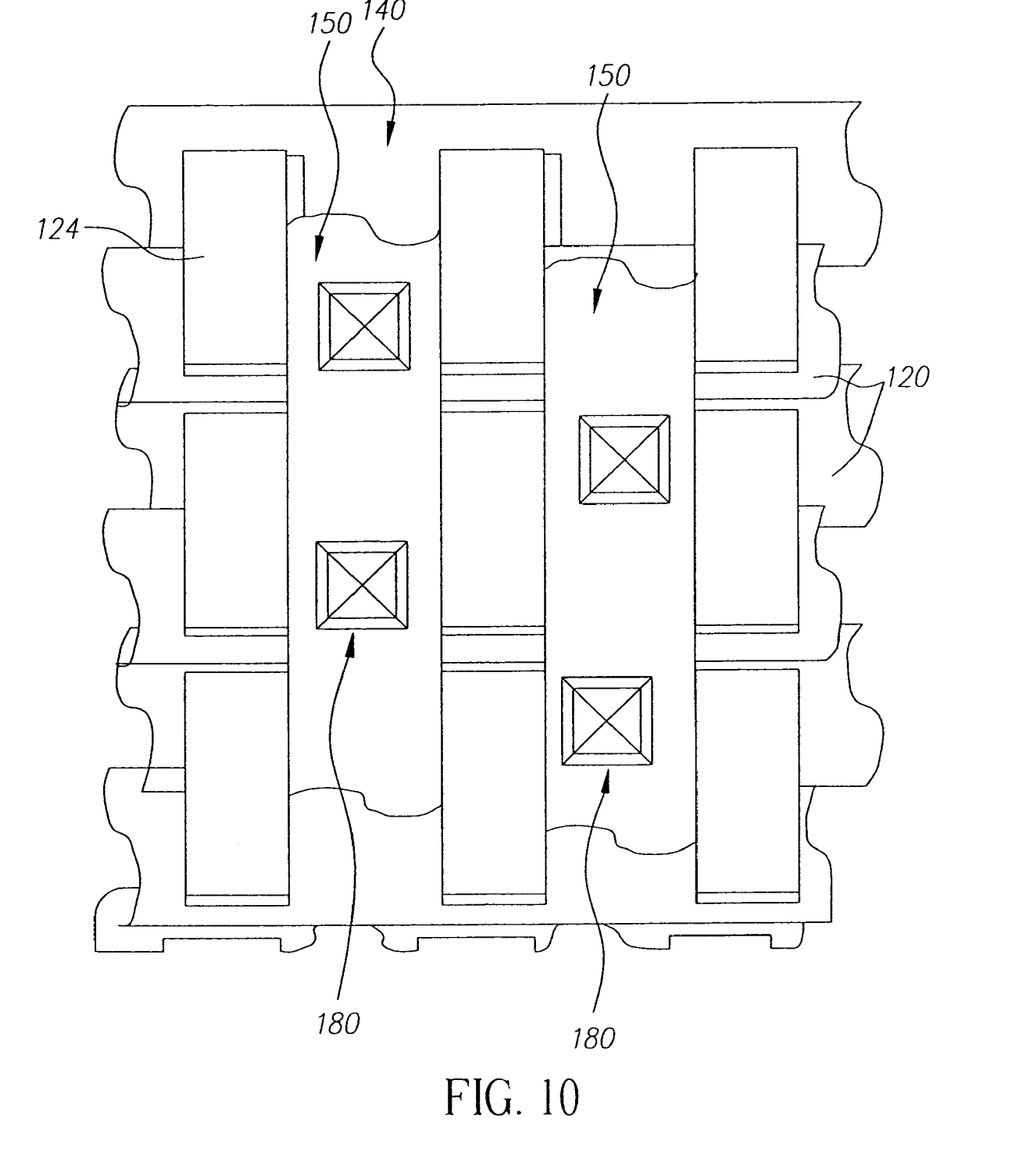
FIG. 10 is a top, plan view of FIG. 9.

Referring to FIG. 9, in localized regions, contact holes 180 are cut through the doped silicon dioxide film 170 and underlying dielectrics 130 to enable electrical contact between the various metal lines and other structures in the image sensor. These structures include the source, drain, and gate regions of transistors built on the substrate, other polysilicon gate regions, and other doped regions of the substrate. The contact hole formation using photolithography and plasma etching is well known in the art for the manufacture of silicon-based semiconductor devices. The same contact hole formation steps are used to cut contact holes 180 centered over, and larger than the openings provided in the lightshield 150. The plasma etch during the contact hole formation removes both the doped silicon dioxide layer 170 in this region as well as the isolation oxide 130 in the opening in the lightshield 150. FIGS. 9 and 10 show cross section and plan views after the contact holes are etched. At this point in the process, both the polysilicon gate electrode 120 and the lightshield 150 are no longer covered with an insulator in areas where the contact hole is made.

Figure 11:
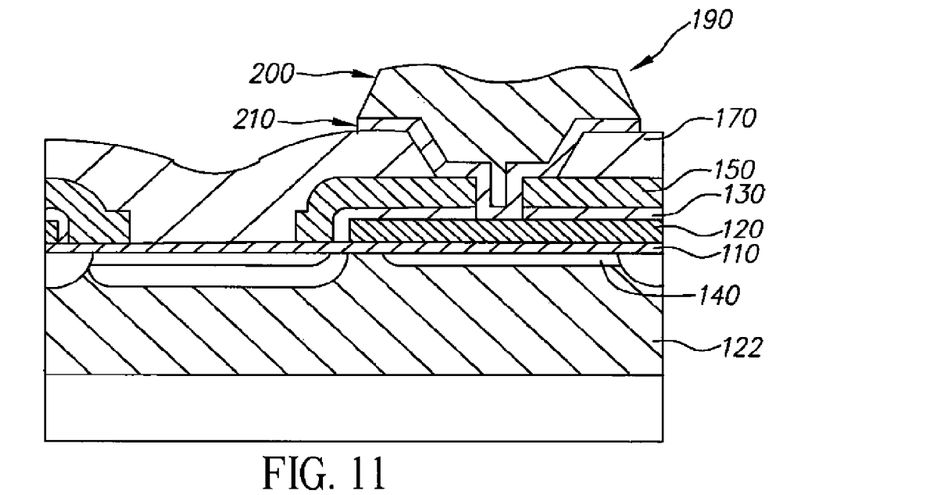
FIG. 11 is a side view in cross section of the image sensor of the present invention illustrating a plug insertion.

Referring to FIG. 11, the next step is to deposit and pattern metal films for the electrical interconnection of various parts of the image sensor and to electrically connect the polysilicon gate electrode 120 to the lightshield 150 where the contact holes have been formed. The interconnect may be a single metal film or may be a combination of several metallic layers. Examples of single metal films are aluminum, or copper, or tungsten. Examples of multiple films include an aluminum film over a layer of titanium and tungsten, or layers of aluminum, titanium nitride and titanium. Multilayer metallization is often used in the semiconductor device industry to prevent silicon diffusion from the substrate into the aluminum metal layer during the manufacturing process. The metal films are patterned using photolithography and plasma etching techniques well known in the art. In the lightshield region, the patterning results in a "plug" of metal which interconnects the polysilicon gate electrode with the lightshield layer where the contact holes have been formed so that the plug 190 contacts the gate electrode 120 so that the gate electrode 120 is electrically connected to the lightshield 150. FIG. 11 shows the cross section of part of the pixel where such a plug 190 has been formed from a bilayer of aluminum 200 and titanium-tungsten films 210. This plug 190 could also be made with a metal layer separate from the device metallization layers. Alternatively, this plug 190 can be formed from just one or more of the metal layers used in device metallization. If the plug is formed from one or more of two or more metallization layers, there are several ways to create the plug. As examples, processes for forming the plug from the titanium-tungsten layer of a bilayer (aluminum & titanium-tungsten layers) metallization scheme are described. In one process, first the titanium-tungsten and the aluminum films are deposited; then the aluminum film is patterned using a photoresist mask and a plasma etch which stops on the titanium-tungsten; then the titanium-tungsten is etched using another photoresist mask and the aluminum left from the first etch. Another process deposits and patterns the titanium-tungsten film, followed by the deposition and patterning of the aluminum film.

Figure 12:
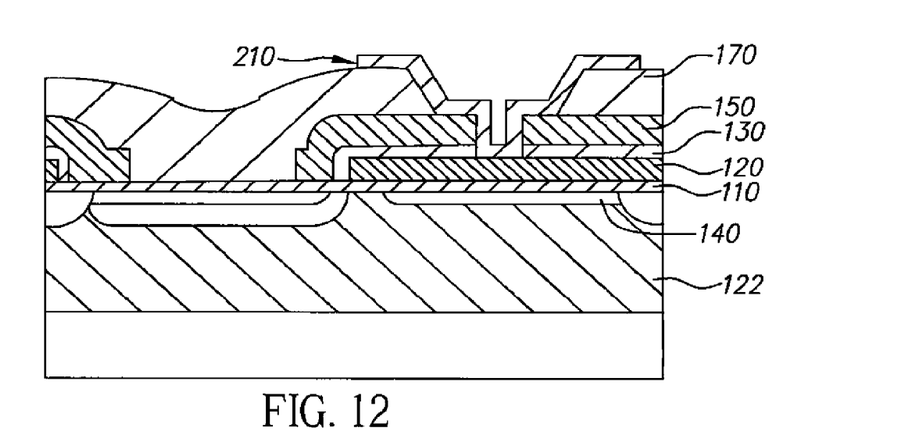
FIG. 12 is an alternative embodiment of FIG. 11.
Figure 13:
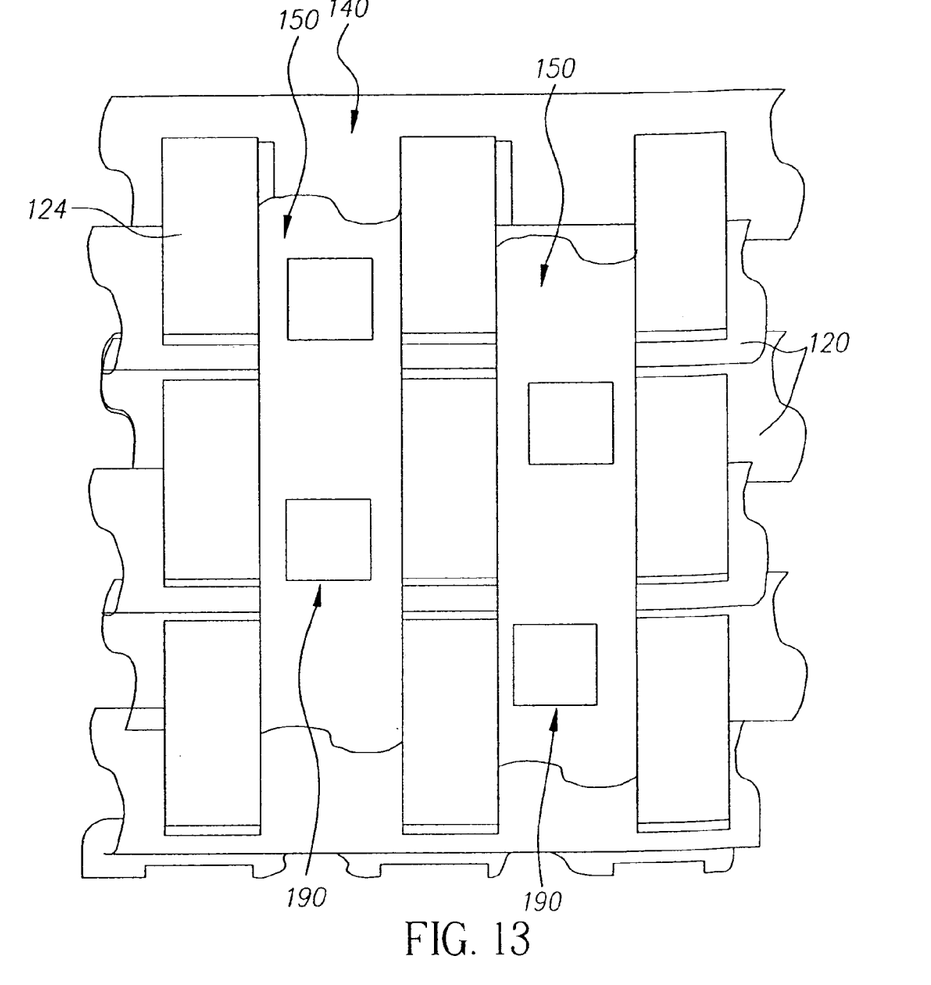
FIG. 13 is a top, plan view of FIG. 12.

FIG. 12 shows a cross section of a pixel formed with just the titanium-tungsten layer 210 of a bilayer metallization process. FIG. 13 shows the plan view after the plugs 190 are formed. The plug 190 may also be extended to form an additional lightshield layer over the refractory metal lightshield. This approach is described below.

After metallization, the device may receive additional layers necessary to form the completed image sensor. These may include a passivation layer, planarization layer, color filter array and lenslets.

Figure 15:
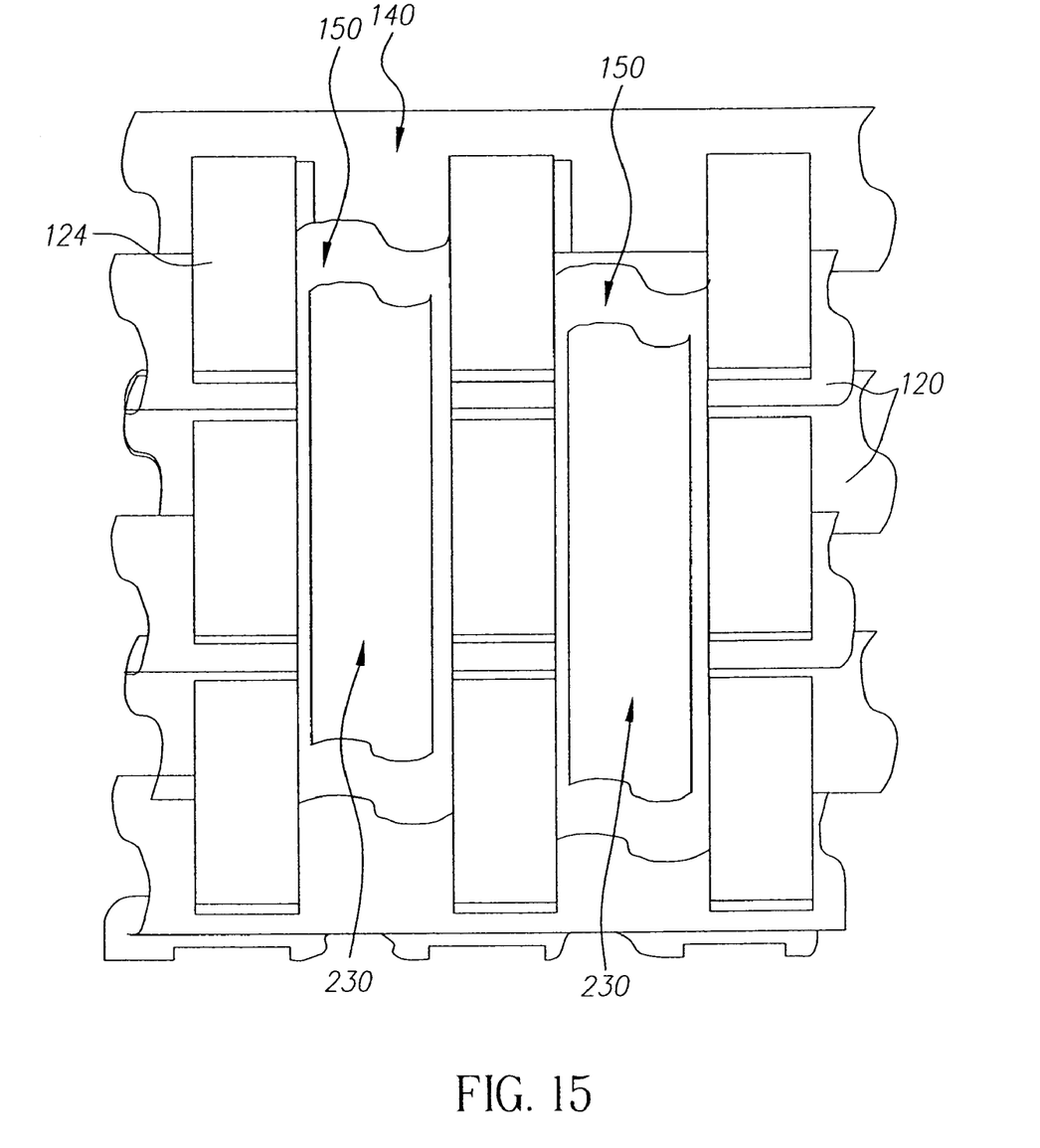
FIG. 15 is an alternative embodiment of the present invention.

FIGS. 11 and 13 depict an electrical connection between the light shield 150 and polysilicon gate electrode 120 using plugs 190 placed in every pixel. Contact holes 180 and plugs 190 may also be placed in a more sparse arrangement such as contact hole 180 and plug 190 in every eighth or sixteenth pixel along a line. This sparse arrangement reduces the chance of defective pixels caused by the manufacturing process. With sparse contacts, there may be variations in reflectivity and photoresponsivity from pixel to pixel. The pixels near the contacts holes 180 and plug 190 may have a different photoresponsivity due to reflectivity differences and differences in lenslet or CFA formation over the lightshield 150. To reduce these non-uniform reflections and photoresponsivity variations, the metal layers 200 and 210 covering the contact holes 180 may be patterned as a continuous line spanning the lightshield, rather than a series of metal plugs. This is shown in FIG. 15 where the metal plug 190 is replaced with a continuous metal line 230.

Figure 14:
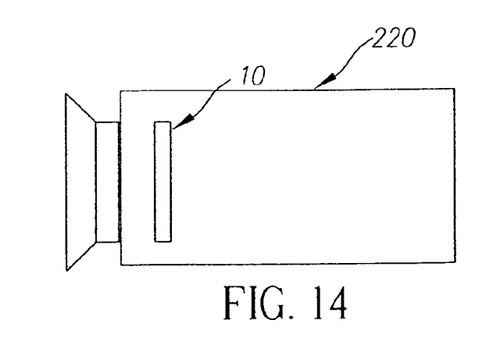
FIG. 14 is a perspective view of a typical commercial embodiment for the image sensor of the present invention.

Referring to FIG. 14, there is shown a perspective view of a digital camera 220 for illustrating a commercial embodiment for the image sensor of the present invention to which an ordinary consumer is accustomed.

The invention has been described with reference to a preferred embodiment. However, it will be appreciated that variations and modifications can be effected by a person of ordinary skill in the art without departing from the scope of the invention.

PARTS LIST 5 image sensor
10 pixels
20 photo-diode
30 transfer gate
40 two-phase vertical charge-coupled device
50 lightshield
60 contact holes
70 prior art gate dielectric
80 lightshield
90 polysilicon layer
95 refractory metal silicide
100 image sensor
110 gate dielectric
120 polysilicon gate electrode
122 silicon substrate dopant regions
124 photosensitive areas
130 silicon dioxide isolation layer
140 vertical CCD
150 lightshield
160 opening
170 silicon oxide film
180 contact holes
190 plug
200 aluminum
210 titanium/tungsten
220 camera
230 continuous metal line

The invention claimed is:

1. A method for manufacturing an image sensor, the method comprising the steps of:
   (a) providing a substrate;
   (b) providing a photo-sensitive area disposed in the substrate;
   (c) providing a transfer mechanism disposed in the substrate for receiving charge from the photo-sensitive area;
   (d) providing a vertical charge-coupled device for receiving charge from the transfer mechanism;
   (e) providing a gate dielectric spanning at least a portion of the vertical charge-coupled device;
   (f) providing a gate electrode spanning at least a portion of the vertical charge-coupled device;
   (g) providing an insulator spanning at least a portion of the vertical charge-coupled device having an opening therethrough;
   (h) providing a lightshield spanning at least a portion of the vertical charge-coupled device having an opening therethrough; and
   (i) inserting a plug through both the opening in the insulator and the opening in the lightshield; wherein the plug contacts the gate electrode so that the gate electrode is electrically connected to the lightshield.

2. The method in claim 1 wherein step (i) includes providing the plug as two metals.

3. The method image sensor as in claim 2, wherein step (i) includes providing the two metals as aluminum and titanium/tungsten.

4. The method as in claim 1, wherein step (i) includes providing the plug as one metal.

5. The method as in claim 4, wherein step (i) includes providing the one metal as titanium/tungsten.

6. The method as in claim 1, wherein step (h) includes having the opening in the lightshield occur in a subset of a plurality of the gate electrodes.

* * * * *